US011088542B1

(12) United States Patent
Langguth et al.

(10) Patent No.: US 11,088,542 B1
(45) Date of Patent: Aug. 10, 2021

(54) SYSTEM AND METHOD FOR TEMPERATURE COMPENSATED ESD PROTECTION

(71) Applicant: Infineon Technologies AG, Neubiberg (DE)

(72) Inventors: Gernot Langguth, Oberhaching (DE); Adrien Benoit Ille, Unterhaching (DE); Steffen Schumann, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 14 days.

(21) Appl. No.: 16/777,195

(22) Filed: Jan. 30, 2020

(51) Int. Cl.
*H02H 9/04* (2006.01)
*H02H 9/00* (2006.01)
*H01L 27/02* (2006.01)

(52) U.S. Cl.
CPC ......... *H02H 9/046* (2013.01); *H01L 27/0255* (2013.01); *H01L 27/0285* (2013.01); *H01L 27/0288* (2013.01); *H02H 9/005* (2013.01)

(58) Field of Classification Search
CPC .... H02H 9/046; H02H 9/005; H01L 27/0288; H01L 27/0255; H01L 27/0285
USPC .......................................................... 361/56
See application file for complete search history.

(56) References Cited

U.S. PATENT DOCUMENTS

| | | | | |
|---|---|---|---|---|
| 4,041,276 A * | 8/1977 | Schwarz | ................ | A61C 19/00 392/484 |
| 5,684,663 A * | 11/1997 | Mitter | .................... | H02H 9/025 361/106 |
| 6,181,541 B1 * | 1/2001 | Souri | ..................... | H02H 3/025 361/101 |
| 6,538,866 B1 * | 3/2003 | Hanzawa | ............ | H01L 27/0251 361/111 |
| 7,589,944 B2 * | 9/2009 | Mergens | ............. | H01L 27/0262 361/111 |
| 8,854,103 B2 * | 10/2014 | Willemen | ........ | H03K 17/08122 327/318 |
| 2011/0150135 A1 * | 6/2011 | Singor | ................ | H01L 27/0288 375/316 |

* cited by examiner

*Primary Examiner* — Dharti H Patel
(74) *Attorney, Agent, or Firm* — Slater Matsil, LLP

(57) ABSTRACT

In accordance with an embodiment, a method for electrostatic discharge (ESD) protection includes: dividing a voltage between a plurality of circuit nodes using a voltage divider circuit to form a divided voltage; compensating a temperature dependency of the divided voltage to form a temperature compensated divided voltage; monitoring the voltage between the plurality of circuit nodes using a transient detection circuit to form a transient detection signal; and activating a clamp circuit coupled between the plurality of circuit nodes based on the temperature compensated divided voltage and based on the transient detection signal.

22 Claims, 5 Drawing Sheets

_US 11,088,542 B1_

SYSTEM AND METHOD FOR TEMPERATURE COMPENSATED ESD PROTECTION

TECHNICAL FIELD

The present invention relates generally to a system and method for temperature compensated electrostatic discharge (ESD) protection.

BACKGROUND

Semiconductor integrated circuits are generally sensitive to ESD events due to the small geometry of their device structures. These sensitive device structures may include, for example, metal-oxide semiconductor (MOS) transistors that are prone to destruction when exposed to high current and voltages. In order to protect these devices, ESD circuits may be coupled to external interface pins and externally connected power supply busses. ESD circuits may also be coupled to sensitive internal nodes, as well as internal power supply busses that are connected to internal power generation circuits, such as linear voltage regulators.

One example of an ESD protection circuit that is often used to provide protection to both internally connected and externally connected power supply nets is an active clamp. These active clamps may include a transistor having a load path connected between two supply nodes to provide a high current discharge path, and a trigger circuit that is configured to activate the transistor during an ESD event or an electrical overstress (EOS) event. These clamp circuits may include, for example, a MOS transistor, a bipolar transistor, or a thyristor. Trigger circuits may be configured to be sensitive to fast current injection ESD events such as charged device model (CDM) and system level ESD events, as well as ESD events with moderate transient current injection such as human body model (HBM) ESD events. In addition to providing protection to fast transient ESD events, ESD protection may also be configured to provide protection to slower transient EOS event having durations longer than 1 µs. During normal operation, however, the clamp circuits may be configured to be non-conducting.

During nominal high temperature operation, either in the field or during high temperature overvoltage reliability tests (e.g. burn-in test, latch-up test, high temperature operating life (HTOL) test, etc.) the clamp circuit is preferably configured to be in a non-conducting state in order to avoid malfunction or destruction of the device due to unintended high currents flowing through the clamp circuits. However, due to the temperature dependent nature of semiconductor devices ESD protection devices are often prone to triggering and/or high leakage currents during operation at high temperatures.

SUMMARY

In accordance with an embodiment, a method for electrostatic discharge (ESD) protection includes: dividing a voltage between a plurality of circuit nodes using a voltage divider circuit to form a divided voltage; compensating a temperature dependency of the divided voltage to form a temperature compensated divided voltage; monitoring the voltage between the plurality of circuit nodes using a transient detection circuit to form a transient detection signal; and activating a clamp circuit coupled between the plurality of circuit nodes based on the temperature compensated divided voltage and based on the transient detection signal.

In accordance with another embodiment, an electrostatic discharge (ESD) circuit includes: a voltage divider circuit coupled between a first circuit node and a second circuit node; a temperature compensation circuit coupled to the voltage divider circuit; a transient detection circuit coupled to at least one of the first circuit node or the second circuit node; and a clamp circuit having a load path coupled between the first circuit node and the second circuit node, and a control node coupled to an output of the voltage divider circuit and to an output of the transient detection circuit.

In accordance with a further embodiment, an integrated circuit includes: a plurality of diode connected transistors and at least one resistor disposed on a semiconductor substrate, the plurality of diode connected transistors and the at least one resistor coupled in series between a first power supply connection and a second power supply connection; a temperature compensation circuit disposed on the semiconductor substrate, the temperature compensation circuit coupled to the plurality of diode connected transistors and the at least one resistor; a filter resistor and a filter capacitor disposed on the semiconductor substrate, the filter resistor and the filter capacitor coupled in series between the first power supply connection and the second power supply connection; a clamping transistor disposed on the semiconductor substrate, the clamping transistor having a load path connected between the first power supply connection and the second power supply connection; a first amplifier disposed on the semiconductor substrate, the first amplifier coupled between the plurality of diode connected transistors and a control node of the clamping transistor; and a second amplifier disposed on the semiconductor substrate, the second amplifier coupled between the filter capacitor and the control node of the clamping transistor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for temperature compensating an active ESD clamp circuit coupled between power supply nodes of an integrated circuit. The invention, however, can be applied to ESD protection circuits configured to protect other circuit nodes, board-level ESD protection circuits, and to temperature compensated trigger circuits in general.

In an embodiment of the present invention, a temperature compensated trigger circuit is used to activate an ESD clamp circuit that is coupled between two power supply nodes. In some embodiments, the temperature compensated trigger circuit includes a voltage divider circuit and a temperature compensation circuit configured to compensate a temperature dependency of the voltage divider circuit. In addition, the trigger circuit may also include a transient detection circuit configured to detect a fast transient event on power supply nodes.

By temperature compensating the voltage divider circuit, an accurate trigger voltage can be ensured over a wide range of temperatures. Accordingly, the trigger voltage can be ensured to be sufficiently greater than a maximum expected power supply voltage in order to lower the risk of false triggering, while preventing the trigger voltage from exceeding a voltage that increases a risk for ESD induced device damage. In addition, by incorporating a transient detection circuit, ESD protection can also be ensured for fast transient ESD events.

Figure 1A:
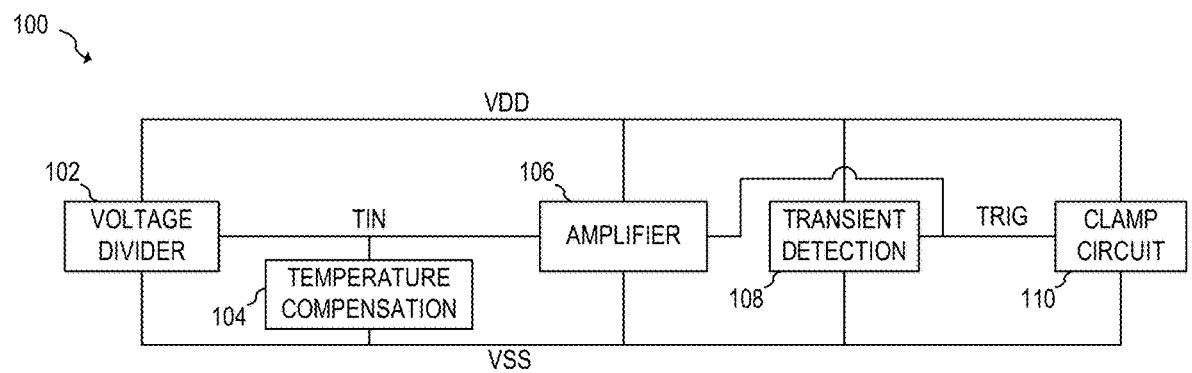
FIG. 1A illustrates a block diagram of an embodiment ESD protection system.

FIG. 1A illustrates ESD protection system 100. In various embodiments, ESD protection system 100 may be disposed on a semiconductor substrate, such as a silicon substrate, and may be configured to provide protection to various circuits and devices that are disposed on the semiconductor substrate. As shown, ESD protection system 100 includes voltage divider 102, temperature compensation circuit 104, amplifier 106, transient detection circuit 108, and clamp circuit 110. As shown, the output of voltage divider 102 is coupled to the input of amplifier 106 and node TIN the output of amplifier 106 is coupled to clamp circuit 110 at node TRIG. The output of transient detection circuit 108 is also coupled to clamp circuit 110. During operation, voltage divider 102 provides a divided voltage at node TIN. This divided voltage may be, for example, a fraction p of the voltage difference between nodes VDD and VSS. Node VDD may also be referred to as a "first power supply connection" and node VSS may also be referred to as a "second power supply connection." For example, in some embodiments $V_{TIN}-V_{VSS}=(V_{VDD}-V_{VSS})/p$, where $V_{TIN}$ is the voltage at node TIN, $V_{VDD}$ is the voltage at node VDD, and $V_{VSS}$ is the voltage at node VSS. In an embodiment, nodes VDD and VSS may be power supply nodes in which node VDD is configured to be coupled to a higher voltage than node VSS during normal operation. In some embodiments, node VSS may be configured to be coupled to a ground voltage or to a negative supply voltage. In yet other embodiments, node VDD may be configured to be coupled to a ground node and node VSS may be configured to be coupled to a negative supply voltage. One or both of node VDD or node VSS may be directly coupled to an external pin of an integrated circuit, or may be coupled to an internal power supply node that derives its supply voltage from an internal supply voltage generation circuit such as a voltage regulator or a charge pump.

In embodiments in which node VSS is coupled to ground, the relationship between $V_{TIN}$ and $V_{VSS}$ can be simplified to $V_{TIN}=V_{VSS}/p$. In various embodiments that utilize temperature dependent circuit elements, fraction p of the voltage difference between nodes VTIN and VSS may be dependent on temperature such that $V_{TIN}=V_{VSS}/p(T)$, where T is the temperature. Accordingly, in various embodiments, temperature compensation circuit 104 is configured to compensate for the temperature dependence of fraction p(T). Thus, if fraction p(T) increases with temperature (e.g. has a positive temperature coefficient) then temperature compensation circuit 104 is configured to provide a compensating signal that decreases with temperature. On the other hand, if fraction p(T) decreases with temperature (e.g. has a negative temperature coefficient) then temperature compensation circuit 104 is configured to provide a compensating signal that increases with temperature. In some embodiments, temperature compensation circuit 104 completely compensates for the temperature dependence of fraction p(T) in voltage divider 102, while in other embodiments, the temperature compensation circuit 104 partially compensates for temperature such that the magnitude of the temperature dependence of fraction p(T) is reduced with respect to an uncompensated voltage divider 102.

In some embodiments, positive temperature coefficients are associated with reverse biased diodes in avalanche breakdown or resistors fabricated with materials such as metals or heavily doped semiconductor (e.g. diffusion resistors), and n-wells, whose resistivity increases with temperature. On the other hand, negative temperature coefficients are associated with forward biased diode or MOS diodes. Polysilicon resistors may be configured to have either a positive or negative temperature coefficient.

During operation, voltage divider 102 in conjunction with temperature compensation circuit 104 provides a temperature compensated voltage $V_{TIN}$ that is a fraction of the voltage difference between $V_{VDD}$ and $V_{VSS}$. This compensated voltage $V_{TIN}$ is amplified by amplifier 106, which provides a portion of trigger signal $V_{TRIG}$ at node TRIG. When trigger signal $V_{TRIG}$ exceeds a threshold voltage of claim device 110, clamp circuit 110 turns on and provides a low impedance path between nodes VDD and VSS. In various embodiments, this low impedance path is configured to safely shunt large currents that occur due to ESD events.

Amplifier 106 may include one or more amplifiers configured to drive clamp circuit 110. In some embodiments, amplifier 106 may be configured to compare voltage $V_{TIN}$ at node TIN with a predetermined voltage or a voltage within a range of voltages in order to determine when to generate trigger signal $V_{TRIG}$. In some embodiments, amplifier 106 may be implemented using one or more inverter circuits.

In various embodiments, transient detection circuit 108 is configured to provide a portion of the trigger signal $V_{TRIG}$ at node TRIG in response to a fast transient signal at node VDD and/or node VSS. The portion of the trigger signal $V_{TRIG}$ generated by transient detection circuit 108 may be referred to as a "transient detection signal." Transient detection circuit 108 may include, for example, filter, such as an RC filter, with a small time constant. In some embodiments, this time constant may be between about 1 ns and about 1 μs depending on the particular embodiments and its specifications. However, time constants outside of this range may be used in some situations. In some embodiments, the time constant may be set to be in the nanosecond range to detect fast-transient events such as CDM or the first peak of a system level ESD pulse. The maximum value for the time constant may be adjusted to meet various system specific specifications. For example, the time constant (and other circuit parameters) may be adjusted in a way that ESD protection system 100 simultaneously meets design targets for supply power up time, ESD circuit area, clamping voltage. The time constant may also be adjusted, for example, to meet predetermined commercial ESD requirements, such as an HBM test specification that defines a current peak at 30 ns. In some embodiments, transient detection circuit 108 may include one or more amplifiers configured to drive clamp circuit 110.

Figure 1B:
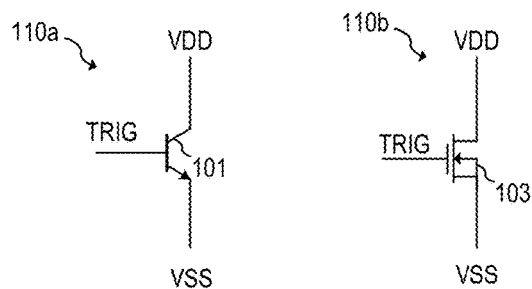
FIG. 1B illustrates schematics of embodiment clamp circuits.

FIG. 1B illustrates two example circuits that may be used to implement clamp circuit 110 in FIG. 1A. For example, clamp circuit 110 may be implemented using circuit 110a that includes bipolar junction transistor 101 (which may be referred to as a "clamping transistor") having a base coupled to trigger node TRIG, an emitter coupled to node VSS and a collector coupled to node VDD. During operation, trigger signal $V_{TIN}$ is applied to the base of transistor 101 in response to an ESD event. As the voltage of trigger signal $V_{TRIG}$ increases, a corresponding current flows from the collector to the emitter of transistor 101. The current path from collector to emitter of junction transistor 101 may also be referred to as a "load path." In various embodiments, the current handling capability of transistor 101 is configured to handle at least an expected amount of current associated with the ESD event.

In another embodiment, clamp circuit 110 may be implemented using circuit 110b, which includes a MOS transistor 103 (also be referred to as a "clamping transistor") having a gate (also be referred to as a "control node") coupled to trigger node TRIG, a source coupled to node VSS and a drain coupled to node VDD. During operation, trigger signal $V_{TIN}$ is applied to the gate of transistor 103 in response to an ESD event. When the voltage of trigger signal $V_{TRIG}$ exceeds the threshold $V_T$ of transistor 103, a corresponding current flows from the drain to the source of transistor 103. The current path from source to drain of transistor 103 may also be referred to as a "load path." In various embodiments, the current handling capability of transistor 103 is configured to handle at least an expected amount of current associated with the ESD event. While a transistor 103 is depicted in FIG. 1B as an NMOS transistor, it should be understood that transistor 103 may be alternatively implemented using a PMOS transistor.

It should be understood that circuits 110a and 110b shown in FIG. 1B are only two of many possible example circuits that could be used to implement clamp circuit 110. In alternative embodiments of the invention, clamp circuit 110 may be implemented using other devices including, but not limited to MOSFETs, IGBTs, JFETs, and thyristors.

Figure 1C:
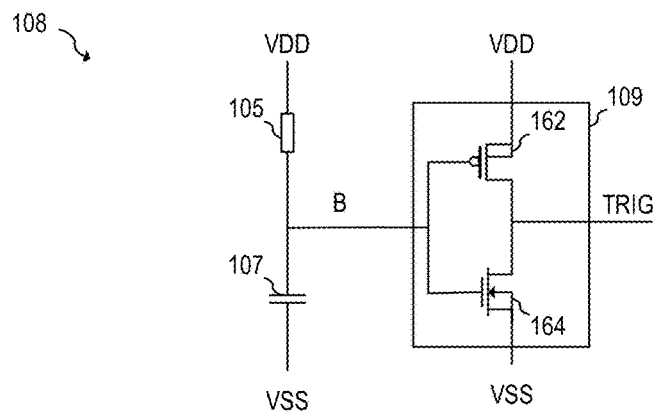
FIG. 1C illustrates a schematic of an embodiment transient detection circuit.

FIG. 1C illustrates a schematic of an example implementation of trigger circuit 108 that includes a series RC circuit implemented using resistor 105 and capacitor 107 connected together at node B, and an amplifier implemented using inverter 109 that includes PMOS transistor 162 and NMOS transistor 164. (Resistor 105 may also be referred to as a "filter resistor" and capacitor 107 may also be referred to as a "filter capacitor.") During normal (e.g. non-ESD) operation, PMOS transistor 162 is turned-off and NMOS transistor applies the voltage $V_{VSS}$ at node VSS to node TRIG. Because of the low-pass nature of the series RC circuit, the gate-source voltage of PMOS transistor 162 increases at a faster rate than the voltage across capacitor 107 when the voltage between nodes VDD and VSS rapidly increases. Thus, when the voltage between nodes VDD and VSS rapidly increases in response to an ESD event, PMOS transistor 162 turns on for the length of time in which gate-source voltage of PMOS transistor 162 exceeds its threshold. Accordingly, the length of time that the PMOS transistor is turned-on is proportional to the RC time constant of resistor 105 and capacitor 107.

It should be understood that the circuit depicted in FIG. 1C is just one of many example circuit that could be used to implement trigger circuit 108. In alternative embodiments, other trigger circuits known in the art could be used. For example, in one embodiment, the positions of resistor 105 and capacitor 107 may be reversed such that capacitor 107 is coupled between node B and node VDD and resistor 105 is coupled between node B and node VSS. In such an embodiment, NMOS 164 is turned-off during normal operation, and is momentarily turned-on during an ESD event. In such an embodiment, an additional inverter circuit 109 may be cascaded with existing inverter circuit 109 to adjust the polarity of trigger signal $V_{TRIG}$ applied to the clamp circuit 110.

Figure 2A:
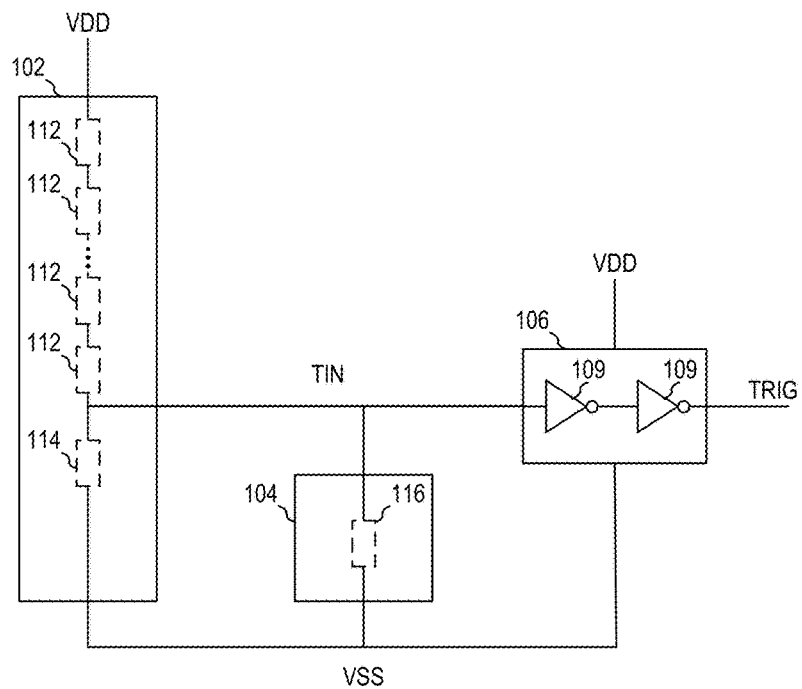
FIG. 2A illustrates a schematic of an embodiment, voltage divider, temperature compensation circuit, and amplifier.

FIG. 2A illustrates a schematic showing a more detailed view of voltage divider 102, temperature compensation circuit 104 and amplifier 106 depicted in FIG. 1A. As shown, voltage divider 102 includes a plurality of first voltage divider elements 112 coupled between node VDD and node TIN, as well as a second voltage divider element 114 coupled between node TIN and node VSS. While only four first voltage divider elements 112 are shown coupled in series between node VDD and node TIN for ease of illustration, it should be understood that any number of first voltage divider elements 112 may be coupled between node VDD and node TIN. Similarly, while only a single second voltage divider element 114 is shown coupled between node TIN and node VSS, it should be understood that two or more second voltage divider elements 114 may be coupled between node TIN and node VSS. In various embodiments, first voltage divider element 112 and second voltage divider element 114 may be implemented using various circuits and devices having a positive temperature coefficient or a negative temperature coefficient as is described below with respect to FIG. 2B. In some embodiments, first voltage divider element 112 or second voltage divider element 114 may be implemented using a circuit element having a temperature stable characteristic.

Temperature compensation circuit 104 includes temperature compensation element 116, which may include a circuit element having a positive temperature coefficient or negative temperature coefficient. The temperature coefficient of temperature compensation element 116 may be configured to fully or partially compensate for the temperature behavior of voltage divider circuit 102. Temperature compensation circuit 104 may include a single temperature compensation element 116, or may include a plurality of temperature compensation circuits 116 coupled together in various configurations as explained further below with respect to FIG. 2C.

Amplifier 106 includes two inverters 109 coupled in series between node TIN and node TRIG. Inverters 109 may be implemented, for example, as described above with respect to FIG. 1C. In some embodiments, greater or fewer than two inverters 109 may be used. In yet further embodiments of the present invention, other amplifier circuits known in the art may be used to implement amplifier 106.

Figure 2B:
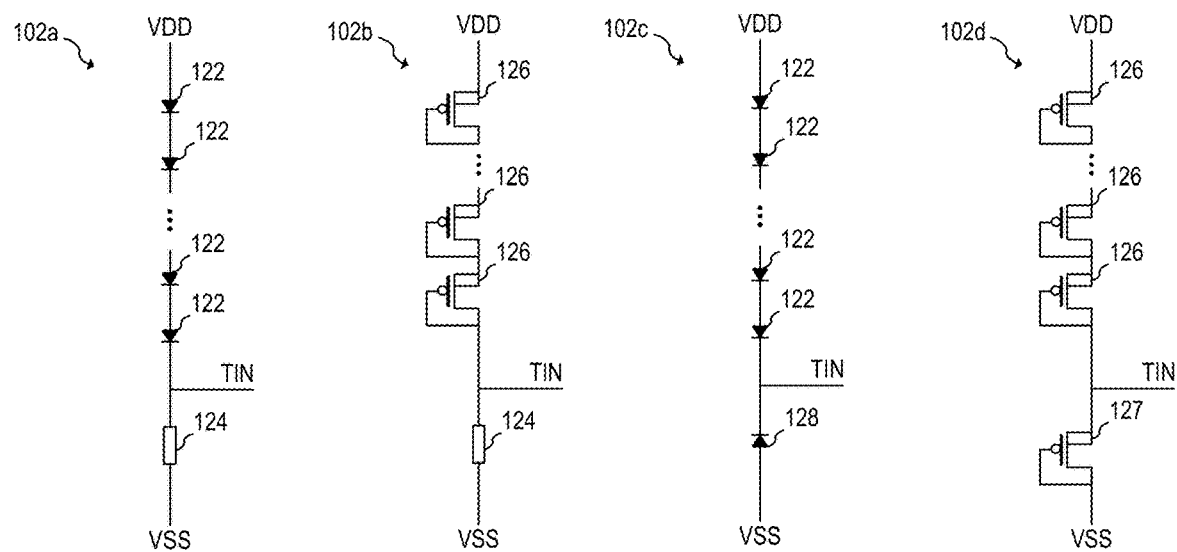
FIG. 2B illustrates schematics of embodiment voltage divider circuits.

FIG. 2B illustrates example implementations 102a, 102b, 102c and 102d that may each be individually used to implement of voltage divider circuit 102. In voltage divider circuit 102a, first voltage divider element 112 is implemented using junction diode 122 (which may also be referred to as a "diode circuit"), and second voltage divider element 114 is implemented using resistor 124. Junction diode 122 may be implemented, for example, using a pn junction formed by two adjacent diffusion regions of opposite semiconductor types, or by a semiconductor junction formed by diffusion regions of a first semiconductor type disposed in a well of a second semiconductor type (e.g. a p+ diffusion disposed in an n-well). Alternatively, junction diode 122 may be formed by other diode structures known in the art, such as an NMOS based diode stack. In an embodiment, resistor 124 has a positive temperature coefficient. During operation, the voltage across each forward biased junction diode 122 decreases over temperature, while the resistance of resistor 124 increases with temperature. Accordingly, the divided voltage $V_{TIN}$ produced by voltage divider 102a (without temperature compensation) increases with increasing temperature. In some embodiments, resistor 124 is implemented using a diffusion resistor, a polysilicon resistor, a metal resistor, or other resistor structure known in the art. Resistor 124 may have a resistance between about 100Ω and about 100 kΩ, however, values outside of this range may be used depending on the particular embodiment.

With respect to voltage divider circuit 102b, which may also be used to implement voltage divider circuit 102, first voltage divider element 112 is implemented using diode connected PMOS device 126, and second voltage divider element 114 is implemented using resistor 124. Alternatively, one or more diode connected PMOS devices 126 may be replaced by a corresponding diode connected NMOS device. In an embodiment resistor 124 has a positive temperature coefficient. During operation, the voltage across each diode connected PMOS device 126 decreases over temperature, while the resistance of resistor 124 increases with temperature. Accordingly, the divided voltage $V_T$IN produced by voltage divider 102b (without temperature compensation) increases with increasing temperature, since the resistor dominates the temperature dependence of the whole stack.

In voltage divider circuit 102c, junction diodes 122 are used to implement first voltage divider elements 112, and diode 128 is used to implement second voltage divider element 114. Diode 128 may be implemented, for example, using a junction diode or a Zener diode. During an ESD event, the voltage between nodes VDD and VSS increases to the point that diode 128 undergoes avalanche and/or Zener breakdown and the voltage across diode 128 is limited to its breakdown voltage. In an embodiment, the voltage across diode 128 used to implement second voltage divider element 114 increases with increasing temperature. Thus, in some embodiments, the divided voltage $V_{TIN}$ produced by voltage divider 102c (without temperature compensation) increases over temperature.

In some embodiments, the output of uncompensated voltage divider 102 may decrease as temperature increases. For example, voltage divider circuit 102d includes diode connected PMOS devices 126, which are used to implement both first voltage divider element 112, and diode connected PMOS device 127, which is used to implement second voltage divider element 114. Alternatively, one or more diode connected PMOS devices 126 may be replaced by a corresponding diode connected NMOS device. In an embodiment, the voltage across diode connected PMOS device 127 decreases with increasing temperature, such that the divided voltage $V_{TIN}$ produced by voltage divider 102d (without temperature compensation) decreases over temperature.

It should be appreciated that the examples shown in FIG. 2B represent just four of many possible ways to implement voltage divider circuit 102. In other embodiments of the present invention, other voltage divider circuits known in the art may be used. For example, other devices besides diodes, PMOS transistors and resistors may be used to implement voltage divider circuit 102. Bipolar transistors, NMOS transistors, JFETs devices, as well as other circuit devices known in the art may be used to implement first voltage divider element 112 and second voltage divider element 114.

Figure 2C:
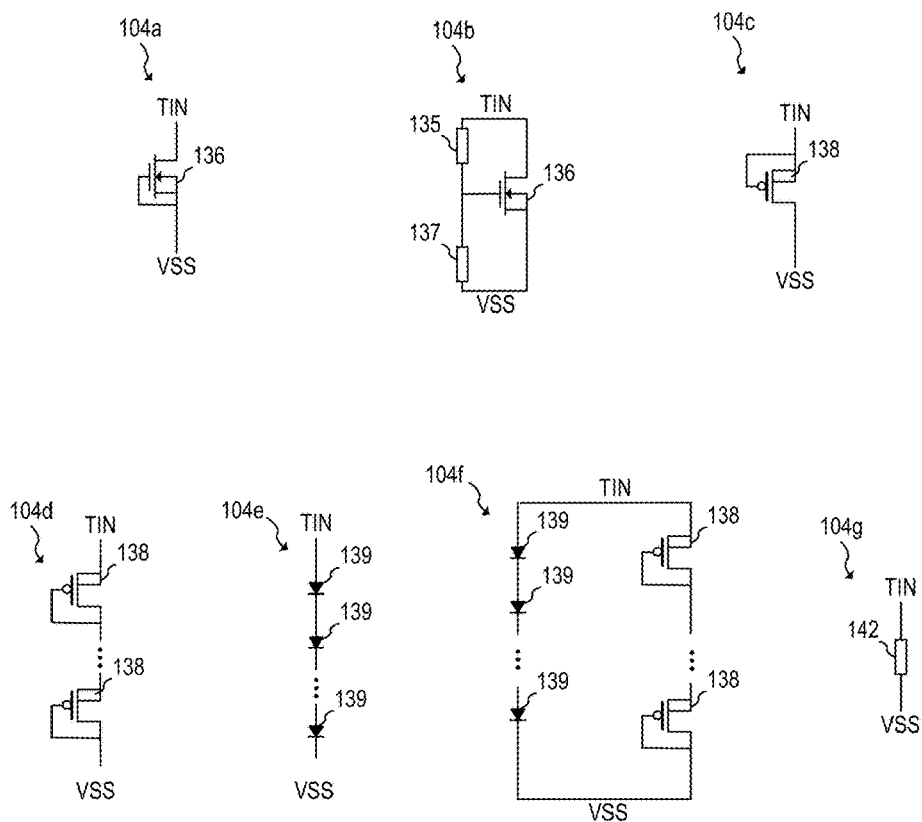
FIG. 2C illustrates schematics of embodiment temperature compensation circuits.

FIG. 2C illustrates example implementations 104a, 104b, 104c, 104d, 104e, 104f and 104g that may each be used to implement temperature compensation circuit 104. As shown, temperature compensation circuit 104a includes an NMOS device 136 having a drain connected to node TIN and a gate and source connected to node VSS. During normal operation, NMOS device 136 is nominally turned-off but has a geometry and temperature dependent leakage current. Therefore, with increasing temperature, the leakage current increases and tends to pull the voltage at node TIN to lower values (e.g., the voltage does not go that high at TIN). Thus, when temperature compensation circuit 104a is paired with an implementation of voltage divider circuit 102 that has a voltage that increases with increasing temperature, such as voltage divider circuits 102a and 102b shown in FIG. 2B, the increased leakage current of NMOS device 136 at higher temperatures compensates for the increased resistance of resistor 124 and the increased current caused by the decrease in forward diode voltage of junction diodes 122 (circuit 102a) and the decrease in voltage across diode connected PMOS devices (circuit 102b), thereby reducing the temperature dependence of voltage $V_T$IN at node TIN. In some embodiments, temperature compensation circuit 104a may also be paired with voltage divider circuit 102c that has a positive temperature coefficient in addition to being paired with voltage divider circuits 102a and 102b.

Temperature compensation circuit 104b includes NMOS device 136 having a drain connected to node TIN, and a source connected to node VSS. The gate of NMOS device 136 is coupled to node TIN via resistor 135 and is coupled to node VSS via resistor 137. In some embodiments, the resistances of resistors 135 and 137 are selected and NMOS device 136 is sized such that NMOS device 136 is biased in the subthreshold regime. For example, in one embodiment, resistors 135 and 137 form a resistor divider with a divider ratio between about 50 kΩ and about 5Ω. Resistors 135 and 137 may be formed using any resistor type known in the art. In alternative embodiments, the resistor network formed by resistors 135 and 137 may have a topology different from the two series resistors 135 and 137 depicted in FIG. 2C.

In various embodiments, the subthreshold current drawn by NMOS device 136 increases with increasing temperature for a given gate voltage. Thus, when temperature compensation circuit 104b is paired with an implementation of voltage divider circuit 102 that has a voltage that increases with increasing temperature, such as voltage divider circuits 102a and 102b shown in FIG. 2B, the increased current drawn by NMOS device 136 compensates for the increased resistance of resistor 124 and the increased current caused by the decrease in voltage across junction diodes 122 (circuit 102a) and diode connected PMOS devices 126 (circuit 102b), thereby reducing the temperature dependence of voltage $V_T$IN at node TIN. In some embodiments, temperature compensation circuit 104b may also be paired with voltage divider circuit 102c that has a positive temperature coefficient in addition to being paired with voltage divider circuits 102a and 102b.

Temperature compensation circuit 104c includes a diode connected PMOS device 138 having a source and gate connected to node TIN, and a drain connected to node VSS. In various embodiments, diode connected PMOS device 138 is sized such that the voltage across diode connected PMOS device 138 decreases with increasing temperature. Thus, when temperature compensation circuit 104c is paired with an implementation of voltage divider circuit 102 that has a voltage that increases with increasing temperature, such as voltage divider circuits 102a and 102b shown in FIG. 2B, the increased current drawn by diode connected PMOS device 138 (as a result of its decreased threshold voltage) at higher temperatures compensates for the increased resistance of resistor 124 and the increased current caused by the decrease in voltage across junction diodes 122 (circuit 102a) and diode connected PMOS devices 126 (circuit 102b), thereby reducing the temperature dependence of voltage $V_T$IN at node TIN. In some embodiments, temperature compensation circuit 104c may also be paired with voltage divider circuit 102c that has a positive temperature coefficient in addition to being paired with voltage divider circuits 102a and 102b.

In some embodiments, temperature compensation circuits may include a plurality of devices coupled in series, as illustrated with respect to temperature compensation circuits 104d, 104e and 104f. As shown, temperature compensation circuit 104d includes a plurality of diode connected PMOS devices 138 coupled in series between nodes TIN and VSS, and temperature compensation circuit 104e includes a plurality of junction diodes coupled in series between nodes TIN and VSS. While only two diode connected PMOS devices 138 are depicted with respect to temperature compensation circuit 104d and only three junction diodes 139 are depicted with respect to temperature compensation circuit 104e, respectively, it should be understood that any number of circuit elements could be coupled in series depending on the particular embodiment and its specifications. The operation of temperature compensation circuits 104d and 104e is similar to the operation of temperature compensation circuit 104c described above. Namely, the voltage across the plurality of circuit elements decreases with increasing temperature. Thus, when temperature compensation circuits 104d and 104e are paired with an implementation of voltage divider circuit 102 that has a voltage that increases with increasing temperature, such as voltage divider circuits 102a, 102b and 102c shown in FIG. 2B, the increased current drawn by diode connected PMOS devices 138 (as a result of their decreased threshold voltage) or junction diodes 139 (as a result of their decreased forward diode voltages) at higher temperatures compensates for the increased resistance of resistor 124 (circuits 102a and 102b), the increased breakdown voltage of diode 128 (circuit 102c), and the increased current caused by the decrease in voltage across junction diodes 122 (circuits 102a and 102c) and diode connected PMOS devices 126 (circuit 102b). Thus, the temperature dependence of voltage $V_{TIN}$ at node TIN is reduced. In some embodiments, temperature compensation circuits 104d and 104e may be coupled in parallel, as shown with respect to temperature compensation circuit 104f.

It should be noted that temperature compensation circuits 104d, 104e and 104f are especially well-suited for pairing with voltage divider circuit 102c having reverse biased diode 128 coupled between node TIN and node VSS. In such embodiments, the number of stacked devices in temperature compensation circuit 104d, 104e or 104f may be selected according to the breakdown voltage of diode 128. For example, for more devices (e.g. diode connected PMOS devices 128 or junction diodes 139) may be coupled in series when diode 128 has a higher breakdown voltage, and few devices may be coupled in series when diode 128 has a lower breakdown voltage.

Embodiment temperature compensation circuits may also be implemented using a resistor, as shown with respect to temperature compensation circuit 104g that includes resistor 142. In an embodiment, resistor 142 has a positive temperature coefficient such that the resistance of resistor increases with increasing temperature. When temperature compensation circuit 104g is paired with an implementation of voltage divider circuit 102 that has a voltage that decreases with increasing temperature, such as voltage divider circuit 102d shown in FIG. 2B, the increased resistance of resistor 142 at higher temperatures compensates for the reduced threshold voltage of diode connected PMOS device 127 at higher temperatures.

It should be appreciated that temperature compensation circuits 104a, 104b, 104c, 104d, 104e, 104f and 104g are just seven non-limiting examples of embodiment temperature compensation circuits that may be used to compensate voltage divider 102. In alternative embodiments of the present invention, other combinations of circuit elements can be used to temperature compensate voltage divider 102.

Figure 2D:
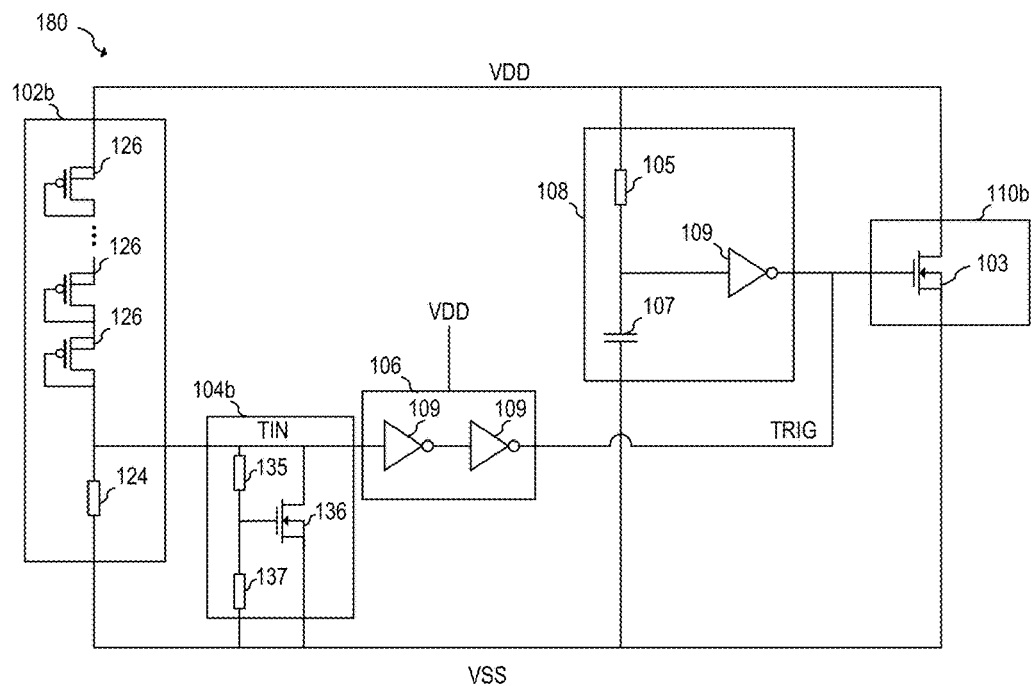
FIG. 2D illustrates a schematic of an embodiment ESD protection system.

FIG. 2D illustrates an embodiment ESD protection system 180 in which voltage divider circuit 102 is implemented using voltage divider circuit 102b described above with respect to FIG. 2B, temperature compensation circuit 104 is implemented using temperature compensation circuit 104b described above with respect to FIG. 2C, transient detection circuit 108 is implemented using the transient detection circuit 108 described above with respect to FIG. 1C, amplifier 106 is implemented using two inverters 109, and clamp circuit 110 is implemented using clamp circuit 110b described above with respect to FIG. 1B. It should be appreciated that embodiment ESD protection system 180 shown in FIG. 2D is just one non-limiting example of how various embodiment voltage divider circuits, temperature compensation circuits, amplifiers, transient detection circuits and clamp circuits may be combined to form an ESD protection circuit.

Figure 3A:
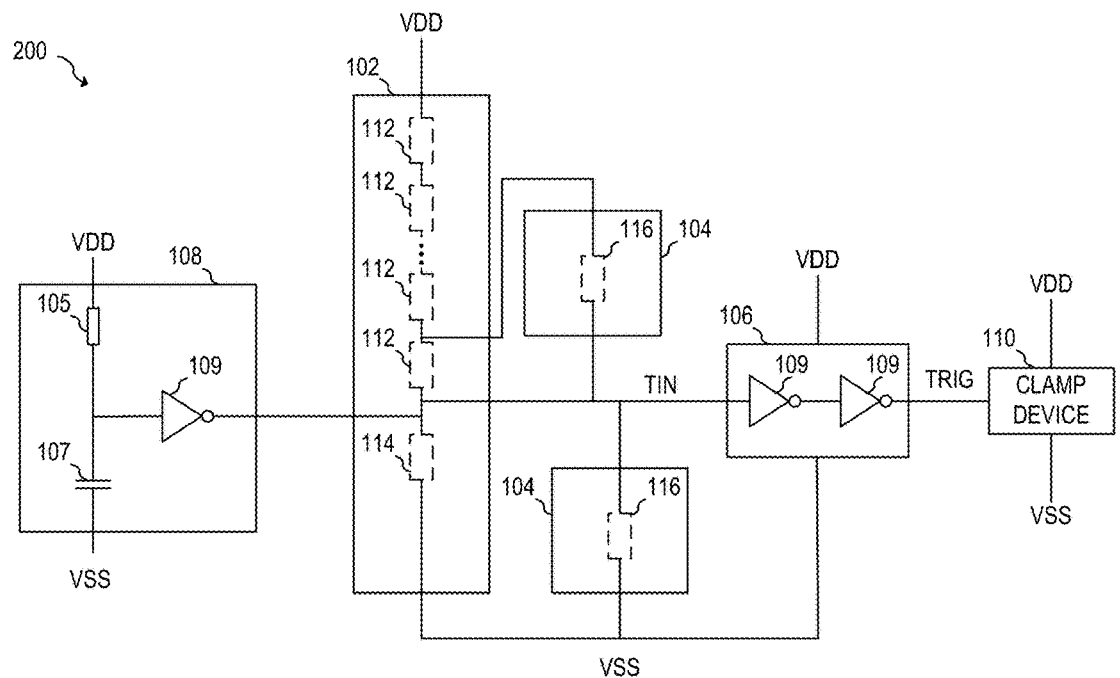
FIGS. 3A and 3B illustrate ESD protection according to alternative embodiments.

FIG. 3A illustrates ESD protection system 200 in accordance with an alternative embodiment of the present invention. ESD protection system 200 shown in FIG. 3A is similar to ESD protection circuit 100 depicted in FIG. 1A with the exception that the output of transient detection circuit 108 is connected to voltage divider circuit 102 at node TIN. Optionally, an additional instance of temperature compensation circuit 104 may be coupled in parallel with one of first voltage divider elements 112. During an ESD event, the voltage at node TIN is quickly boosted when transient detection circuit 108 detects a fast transient at nodes VDD and VSS, and additional compensation circuit 104 provides additional temperature compensation to voltage divider 102. In some embodiments, the additional compensation circuit 104 may be omitted.

Figure 3B:
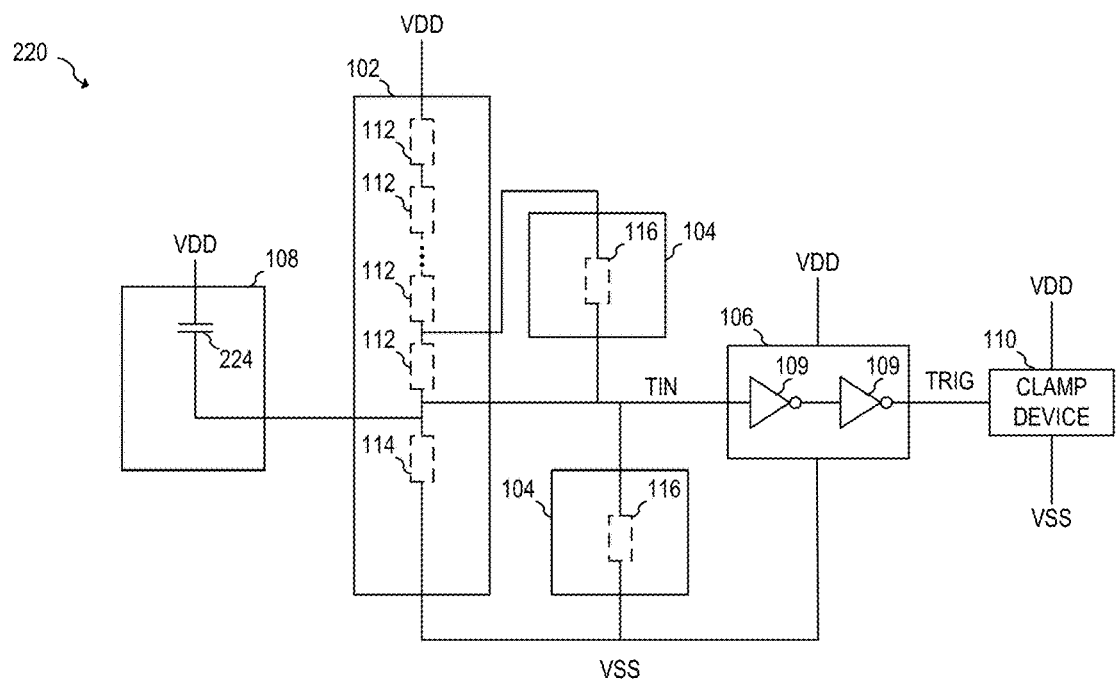

ESD protection system 220 shown in FIG. 3B is similar to ESD protection system 200 shown in FIG. 3A, with the exception that transient detection circuit 108 is implemented using a capacitor 224 coupled between node VDD and the voltage divider 102. During an ESD event associated with a fast transient voltage increase at node VDD, the increased voltage at node VDD is coupled to node TIN, thereby increasing the voltage at node TIN.

Figure 4:
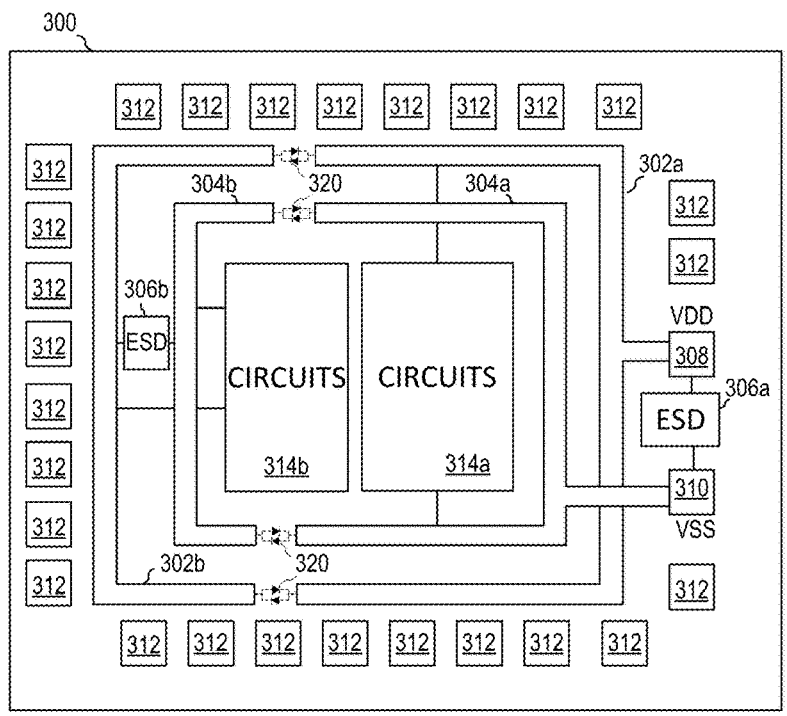
FIG. 4 illustrates a plan view of an integrated circuit that utilizes embodiment ESD protection systems.

FIG. 4 illustrates a plan view of an integrated circuit 300 that incorporates embodiment ESD protection systems described herein. As shown, integrated circuit 300 includes a plurality of signal pads 312, a first power supply pad 308 connected to node VDD and power supply rail 302a, and a second power supply pad 310 that is connected to node VSS and power supply rail 304a, which provide power to circuits 314a. ESD protection circuit 306a coupled between nodes VDD and VSS, which may be implemented using any of the ESD protection system described above, provides ESD protection to circuits 314a coupled to power supply rails 302a and 304a.

Integrated circuit also includes internal power supply rails 302b and 304b that are coupled to power supply rails 302a and 304b via ESD coupling networks 320, which may be implemented using diodes as shown. In some embodiments, internal power supply rails 302b and 304b and circuits 314b that are powered by internal power supply rails 302b and 304b form a separate power domain from circuits 314a and power supply rails 302a and 304a. In various embodiments, ESD protection circuit 306b coupled to internal power supply rails 302b and 304b may be implemented using any of the ESD protection system described above to provide ESD protection to circuits 314b coupled to internal power supply rails 302b and 304b. It should be appreciated that integrated circuit 300 shown in FIG. 4 is just one specific example of how embodiment ESD protection systems may be incorporated in an integrated circuit. In alternative embodiments, any number of embodiment ESD protection circuits may be used to provide protection to any number of power supply domains.

Figure 5:
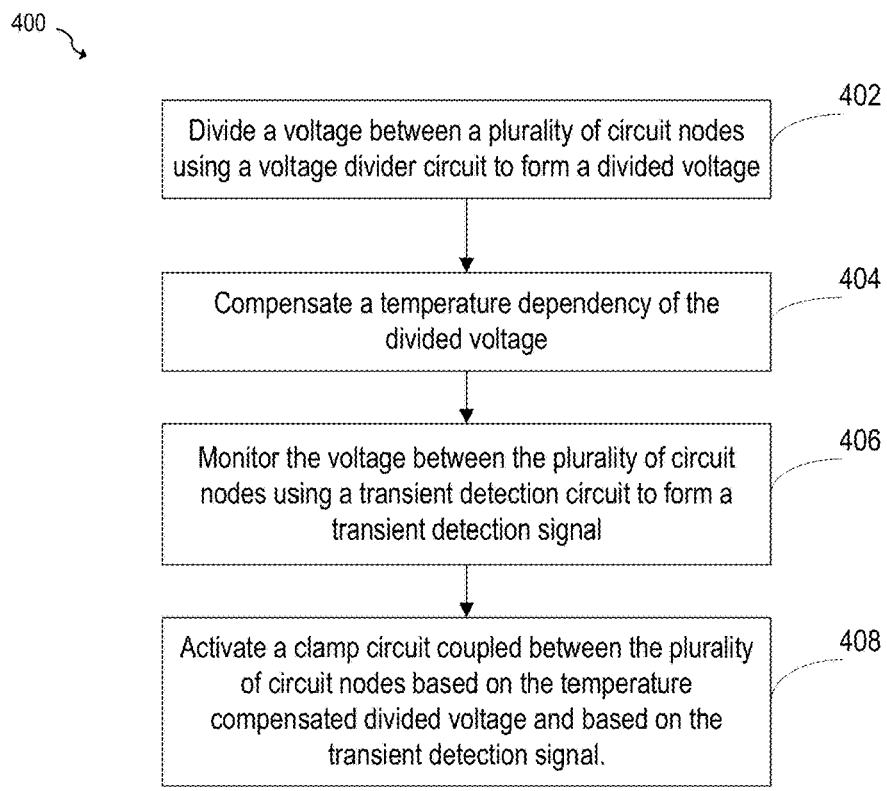
FIG. 5 illustrates a block diagram of an embodiment ESD protection method.

FIG. 5 illustrates a flowchart of an embodiment method 400 of ESD protection that may be applied to embodiment ESD protection system described above. In step 402, a voltage is divided between a plurality of circuit nodes using a voltage divider circuit to form a divided voltage. In some embodiments, voltage divider circuit 102 described in embodiments herein may be used to provide the divided voltage. In one embodiment, nodes VDD and VSS described with respect to embodiments above form the plurality of circuit nodes. In step 404, a temperature dependence of the divided voltage is compensated. In various embodiments, temperature compensation circuit 104 described in the various embodiments above may be used to temperature compensate the divided voltage.

In step 406, the voltage between the plurality of circuit nodes is compensated using a transient detection circuit, such as transient detection circuit 108 described in embodiments above, to form a transient detection signal. In step 408, a clamp circuit coupled between the plurality of circuit nodes is activated based on the compensated divided voltage and based on the transient detection circuit. In some embodiments, the clamp circuit may be implemented using clamp circuit 110 described with respect to embodiments herein. For example, the clamp circuit may activated based on an output (node TRIG) from amplifier 106 and/or transient detection circuit 108 described with respect to embodiments herein. It should be understood that in some embodiments, some or all of method steps 402, 404, 406 and 408 are performed simultaneously.

Embodiments of the present invention are summarized here. Other embodiments can also be understood from the entirety of the specification and the claims filed herein.

Example 1. A method for electrostatic discharge (ESD) protection, the method including: dividing a voltage between a plurality of circuit nodes using a voltage divider circuit to form a divided voltage; compensating a temperature dependency of the divided voltage to form a temperature compensated divided voltage; monitoring the voltage between the plurality of circuit nodes using a transient detection circuit to form a transient detection signal; and activating a clamp circuit coupled between the plurality of circuit nodes based on the temperature compensated divided voltage and based on the transient detection signal.

Example 2. The method of example 1, further including amplifying the temperature compensated divided voltage and providing the amplified temperature compensated divided voltage to an input node of the clamp circuit.

Example 3. The method of one of examples 1 or 2, further including amplifying the transient detection signal and providing the amplified transient detection signal to the clamp circuit.

Example 4. The method of one of examples 1 to 3, further including providing the transient detection signal to the voltage divider circuit.

Example 5. The method of one of examples 1 to 4, further including amplifying the transient detection signal, and providing the amplified transient detection signal to the voltage divider circuit.

Example 6. The method of one of examples 1 to 5, where temperature compensating the voltage divider circuit includes providing a temperature dependent current to a node of the voltage divider circuit.

Example 7. The method of one of examples 1 to 6, where the voltage divider circuit includes a plurality of diode circuits coupled in series with a resistor.

Example 8. The method of example 7, where: each diode circuit of the plurality of diode circuits includes a diode connected transistor; and temperature compensating the voltage divider circuit includes using a temperature compensation circuit including a transistor having a load path coupled between a node of the voltage divider circuit and one of the plurality of circuit nodes, and a resistor network coupled between the node of the voltage divider circuit and a control node of the transistor.

Example 9. The method of one of examples 1 to 8, where the transient detection circuit includes an RC circuit.

Example 10. An electrostatic discharge (ESD) circuit including: a voltage divider circuit coupled between a first circuit node and a second circuit node; a temperature compensation circuit coupled to the voltage divider circuit; a transient detection circuit coupled to at least one of the first circuit node or the second circuit node; and a clamp circuit having a load path coupled between the first circuit node and the second circuit node, and a control node coupled to an output of the voltage divider circuit and to an output of the transient detection circuit.

Example 11. The ESD circuit of example 10, further including a first amplifier coupled between the output of the voltage divider circuit and the control node of the clamp circuit.

Example 12. The ESD circuit of example 11, further including a second amplifier coupled between the output of the transient detection circuit and the control node of the clamp circuit.

Example 13. The ESD circuit of example 11, further including a second amplifier coupled between the output of the transient detection circuit and the voltage divider circuit.

Example 14. The ESD circuit of one of examples 11 to 13, where the first amplifier includes an inverter.

Example 15. The ESD circuit of one of examples 1 to 14, where: the voltage divider circuit includes a plurality of diode circuits coupled in series with a resistor; and the temperature compensation circuit is configured to provide a temperature dependent current.

Example 16. The ESD circuit of example 15, where: each of the plurality of diode circuits includes a diode connected transistor; and the temperature compensation circuit includes a transistor having a load path coupled between a node of the voltage divider circuit and one of first circuit node or the second circuit node, and a resistor network coupled between the node of the voltage divider circuit and a control node of the transistor.

Example 17. The ESD circuit of one of examples 10 to 16, where the temperature compensation circuit includes a plurality of temperature compensation circuits.

Example 18. The ESD circuit of one of examples 10 to 17, where the first circuit node is a power supply node, and the second circuit node is a ground node.

Example 19. The ESD circuit of one of examples 10 to 18, where the transient detection circuit includes an RC circuit coupled to at least one of the first circuit node or the second circuit node.

Example 20. An integrated circuit including: a plurality of diode connected transistors and at least one resistor disposed on a semiconductor substrate, the plurality of diode connected transistors and the at least one resistor coupled in series between a first power supply connection and a second power supply connection; a temperature compensation circuit disposed on the semiconductor substrate, the temperature compensation circuit coupled to the plurality of diode connected transistors and the at least one resistor; a filter resistor and a filter capacitor disposed on the semiconductor substrate, the filter resistor and the filter capacitor coupled in series between the first power supply connection and the second power supply connection; a clamping transistor disposed on the semiconductor substrate, the clamping transistor having a load path connected between the first power supply connection and the second power supply connection; a first amplifier disposed on the semiconductor substrate, the first amplifier coupled between the plurality of diode connected transistors and a control node of the clamping transistor; and a second amplifier disposed on the semiconductor substrate, the second amplifier coupled between the filter capacitor and the control node of the clamping transistor.

Example 21. The integrated circuit of example 20, where: each of the plurality of diode connected transistors includes a diode connected MOS transistor; and the clamping transistor includes a MOS transistor.

Example 22. The integrated circuit of one of examples 20 or 21, where: the temperature compensation circuit includes: a first MOS transistor having a first source/drain coupled to the plurality of diode connected transistors and a second source/drain coupled to the second power supply connection; a first resistor coupled between a gate of the first MOS transistor and the first source/drain; and a second resistor coupled between the gate and the second source/drain.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for electrostatic discharge (ESD) protection, the method comprising:
   dividing a voltage between a plurality of circuit nodes using a voltage divider circuit to form a divided voltage;
   compensating a temperature dependency of the divided voltage to form a temperature compensated divided voltage;
   monitoring the voltage between the plurality of circuit nodes using a transient detection circuit to form a transient detection signal; and
   activating a clamp circuit coupled between the plurality of circuit nodes based on the temperature compensated divided voltage and based on the transient detection signal.

2. The method of claim 1, further comprising amplifying the temperature compensated divided voltage and providing the amplified temperature compensated divided voltage to an input node of the clamp circuit.

3. The method of claim 2, further comprising amplifying the transient detection signal and providing the amplified transient detection signal to the clamp circuit.

4. The method of claim 2, further comprising providing the transient detection signal to the voltage divider circuit.

5. The method of claim 2, further comprising amplifying the transient detection signal, and providing the amplified transient detection signal to the voltage divider circuit.

6. The method of claim 1, wherein temperature compensating the voltage divider circuit comprises providing a temperature dependent current to a node of the voltage divider circuit.

7. The method of claim 1, wherein the voltage divider circuit comprises a plurality of diode circuits coupled in series with a resistor.

8. The method of claim 7, wherein:
   each diode circuit of the plurality of diode circuits comprises a diode connected transistor; and
   temperature compensating the voltage divider circuit comprises using a temperature compensation circuit comprising a transistor having a load path coupled between a node of the voltage divider circuit and one of the plurality of circuit nodes, and a resistor network coupled between the node of the voltage divider circuit and a control node of the transistor.

9. The method of claim 1, wherein the transient detection circuit comprises an RC circuit.

10. An electrostatic discharge (ESD) circuit comprising:
   a voltage divider circuit coupled between a first circuit node and a second circuit node;
   a temperature compensation circuit coupled to the voltage divider circuit;
   a transient detection circuit coupled to at least one of the first circuit node or the second circuit node; and
   a clamp circuit having a load path coupled between the first circuit node and the second circuit node, and a control node coupled to an output of the voltage divider circuit and to an output of the transient detection circuit.

11. The ESD circuit of claim 10, further comprising a first amplifier coupled between the output of the voltage divider circuit and the control node of the clamp circuit.

12. The ESD circuit of claim 11, further comprising a second amplifier coupled between the output of the transient detection circuit and the control node of the clamp circuit.

13. The ESD circuit of claim 11, further comprising a second amplifier coupled between the output of the transient detection circuit and the voltage divider circuit.

14. The ESD circuit of claim 11, wherein the first amplifier comprises an inverter.

15. The ESD circuit of claim 10, wherein:
the voltage divider circuit comprises a plurality of diode circuits coupled in series with a resistor; and
the temperature compensation circuit is configured to provide a temperature dependent current.

16. The ESD circuit of claim 15, wherein:
each of the plurality of diode circuits comprises a diode connected transistor; and
the temperature compensation circuit comprises a transistor having a load path coupled between a node of the voltage divider circuit and one of first circuit node or the second circuit node, and a resistor network coupled between the node of the voltage divider circuit and a control node of the transistor.

17. The ESD circuit of claim 15, wherein the temperature compensation circuit comprises a plurality of temperature compensation circuits.

18. The ESD circuit of claim 10, wherein the first circuit node is a power supply node, and the second circuit node is a ground node.

19. The ESD circuit of claim 10, wherein the transient detection circuit comprises an RC circuit coupled to at least one of the first circuit node or the second circuit node.

20. An integrated circuit comprising:
a plurality of diode connected transistors and at least one resistor disposed on a semiconductor substrate, the plurality of diode connected transistors and the at least one resistor coupled in series between a first power supply connection and a second power supply connection;
a temperature compensation circuit disposed on the semiconductor substrate, the temperature compensation circuit coupled to the plurality of diode connected transistors and the at least one resistor;
a filter resistor and a filter capacitor disposed on the semiconductor substrate, the filter resistor and the filter capacitor coupled in series between the first power supply connection and the second power supply connection;
a clamping transistor disposed on the semiconductor substrate, the clamping transistor having a load path connected between the first power supply connection and the second power supply connection;
a first amplifier disposed on the semiconductor substrate, the first amplifier coupled between the plurality of diode connected transistors and a control node of the clamping transistor; and
a second amplifier disposed on the semiconductor substrate, the second amplifier coupled between the filter capacitor and the control node of the clamping transistor.

21. The integrated circuit of claim 20, wherein:
each of the plurality of diode connected transistors comprises a diode connected MOS transistor; and
the clamping transistor comprises a MOS transistor.

22. The integrated circuit of claim 21, wherein: the temperature compensation circuit comprises:
a first MOS transistor having a first source/drain coupled to the plurality of diode connected transistors and a second source/drain coupled to the second power supply connection;
a first resistor coupled between a gate of the first MOS transistor and the first source/drain; and
a second resistor coupled between the gate and the second source/drain.

* * * * *